United States Patent [19]

Hock, Jr. et al.

[11] Patent Number: 5,055,169
[45] Date of Patent: Oct. 8, 1991

[54] METHOD OF MAKING MIXED METAL OXIDE COATED SUBSTRATES

[75] Inventors: Vincent F. Hock, Jr.; John H. Givens, both of Champaign, Ill.; Joseph E. Suarez, South Burlington, Vt.; James M. Rigsbee, Champaign, Ill.

[73] Assignee: The United States of America as represented by the Secretary of the Army, Washington, D.C.

[21] Appl. No.: 325,172

[22] Filed: Mar. 17, 1989

[51] Int. Cl.$^5$ ............................................. C23C 14/08
[52] U.S. Cl. ........................... 204/192.31; 204/298.05
[58] Field of Search ...................... 204/192.31, 298.05; 427/38, 39

[56] References Cited

U.S. PATENT DOCUMENTS 3,632,498  1/1972  Beer ................................. 204/290 F
3,840,443  10/1974 Beer ................................. 204/37.1
3,948,751  4/1976  Bianchi et al. ................... 204/290 F

OTHER PUBLICATIONS

J. J. Bessot, New Vacuum Deposition Techniques, Metal Finishing, Mar. 1980, pp. 21–26, Apr. 1980, p. 63–66.
Goode et al., Ion plating, Vacuum, vol. 29, No. 1, Jan. 1979, pp. 9–11, 143–14,
B. Chapman, Glow Discharge Processes, John Wiley & Sons, New York, 1980, pp. 139–153.
Kumar et al., Ceramic Coated Anode for Cathodic Protection, Materials Performance, (Jun. 1984), pp. 24–28.
Badawy et al., "Kinetics of the Dissolution Behaviour of Anode Oxide Films on Niobium in NaOH Solutions", Journal of Applied Electrochemistry, 17 (1987), pp. 559–566.
Salvador et al., "Photoelectronic Properties of a $Ti_{0.97}Ru_{0.03}$ Biphase Crystal in an Aqueous Electrolyte", Mat. Res. Bull., vol. 19, pp. 643–648, 1984.
Gautron et al., "Reduction and Doping of Semiconductor Rutile ($TiO_2$)", Mat. Res. Bul-, vol. 16, pp. 575–580, 1981.
Korczynski et al., "Studies on the Durability of Platinum and Ruthenium Oxide Coated Titanium Anodes in the D–Ribono–y–Lactone Electro–Reduction Proceess", Corrosion Science, vol. 21, No. 5, pp. 329–332, 1981.
Moulton, "Information Sources for Electrochemistry", Jour. of Applied Electrochemistry 16 (1986) 1–7.
Verwey et al., "Controlled Valency Semiconductors", Philips Res. Rep. 5., 173–187, 1950.
Tuller, "Highly Conductive Ceramics".
Wilson, "The Theory of Metals", Chapter V Semiconductors, Cambridge Press, 1953.
Smits, "Measurement of Sheet Resistivities with the Four–Point Probe". Bell Systems Tech. Jour., May 1958.
Wold et al., "Unusual Electronic Properties of Defect and Substituted Oxides with the Rutile Structure", Final Report U.S. Army Contract NHo. DAAG46-8-3-Koo15, Mar. 1987.
Hock et al., "Structure, Chemistry, and Properties of Mixed Metal Oxides", National Assoc. of Corrosion Engineers proceeding from the 1988 National Meeting in St. Louis, Mo., Mar. 21–25, 1988, Paper No. 230.

Primary Examiner—John F. Niebling
Assistant Examiner—William T. Leader
Attorney, Agent, or Firm—Darrell E. Hollis

[57] ABSTRACT

In a reactive ion plating process utilizing radio frequency power, the rate of evaporation of a noble metal such as ruthenium or iridium, the rate of evaporation of a valve metal such as titanium, and the partial oxygen pressure are adjusted to produce electrically conductive mixed metal oxide ceramic coating on a valve metal substrate. The noble metal constitutes 10–20 percent of the metal atoms in the coating. The coated substrate can sustain 150 amperes per square meter of exposed coating surface in fresh water electrolyte for at least 20 hours, and preferably at least 75 hours, without an excessive increase in the voltage level required to maintain that current density.

10 Claims, 4 Drawing Sheets

METHOD OF MAKING MIXED METAL OXIDE COATED SUBSTRATES

STATEMENT OF GOVERNMENT INTEREST

The invention described and claimed herein may be manufactured and used by or for the Government of the United States of America for governmental purposes without the payment of royalties thereon or therefor.

FIELD OF THE INVENTION

The invention relates to a mixed metal oxide coated substrate and a method of preparation thereof. In one aspect, the invention relates to an anode comprising a coating of a noble metal oxide and a valve metal oxide on a valve metal substrate surface. In a more specific aspect, the invention relates to such an anode having the ability to provide a higher current flow without a substantial increase in the voltage required. In another aspect, the invention relates to a reactive ion plating process utilizing high frequency alternating voltage to coat a valve metal substrate surface with a mixture of valve metal oxide and noble metal oxide. In a further aspect, the invention relates to a process for controlling the evaporation rates of a noble metal and a valve metal in a reactive ion chamber and the oxygen flow rate to the chamber to achieve a desired coating composition. In yet another aspect, the invention relates to an impressed current anode useful for cathodic protection of metallic structures.

BACKGROUND OF THE INVENTION

In "Fabrication of Electrically Conductive Metal Oxide Coating by Reactive Ion Plating," J. Vac. Sci. Technol. A3(6), Nov/Dec 1985, pp. 2661–2664, Hock, Stephenson, Givens, and Rigsbee disclose the preparation of an electrically conductive mixed metal oxide ceramic coating on a substrate by the use of the reactive ion plating process. They deposited $RuO_2$ - $TiO_2$ films and niobium-doped titanium oxide films onto niobium, 1018 steel, and glass substrates by electron beam melting pure ruthenium, titanium, and niobium metals into a DC-generated oxygen-argon plasma. Preliminary characterization data pertaining to the niobium-doped titanium oxide films deposited onto all three substrate materials indicated that the film morphology was dense and columnar. The films were characterized as a microcrystalline metal oxide consisting of niobium in solution with both anatase and rutile $TiO_2$. The $RuO_2$ - $TiO_2$ films, which were also deposited onto all three substrate materials, were characterized as a microcrystalline mixed metal oxide of $RuO_2$ and $TiO_2$ (rutile) with a morphology similar to that described for the niobium-doped titanium oxide films. The microcrystalline structure of the films was attributed to the high oxygen partial pressure and/or high oxygen-argon total pressure within the ion plating deposition chamber during film fabrication. A mixed metal oxide coating on a niobium substrate, wherein 55 percent of the metal atoms were titanium and 45 percent were ruthenium, had a very low dissolution rate in tap water of 0.003 gram/ampere/year and a resistivity of 0.0018 ohm-cm. A niobium doped titanium dioxide, wherein 9.5 percent of the metal atoms in the coating were niobium and 90.5 percent of the metal atoms in the coating were titanium, had a dissolution rate of tap water of 0.054 gram/ampere/year and a resistivity of 0.08 ohm-cm. While these anodes have worthwhile characteristics, the life of the coatings at high current densities was not as great as is desired for various applications.

SUMMARY OF THE INVENTION

It has now been discovered that the utilization of an alternating voltage, preferably a radio frequency voltage, on the substrate in the reactive ion plating process provides an improved coating. It has also been discovered that controlling the rates of evaporation of the coating metals and the rate of oxygen flow to the reactive ion plating chamber permits the production of electrically conductive mixed metal oxide ceramic anodes having the ability to provide high current densities over a substantial length of time without a drastic increase in the voltage level necessary to sustain the high current density Accordingly, it is an object of the invention to provide new and improved mixed metal oxide coatings. Another object of the invention is to provide mixed metal oxide anodes having longer use-life, particularly in high current density applications. It is an object of the invention to provide a new and improved process for preparing mixed metal oxide coatings. Another object of the invention is to provide an improved method for achieving a mixed metal oxide coating having desired chemical and physical characteristics.

It is an object of the invention to provide a new and improved reactive ion plating method of fabrication of mixed metal oxide films onto valve metal substrates. Another object of the invention is to provide a method of fabrication of mixed metal oxide films with the metal atoms in the films consisting of 80 to 90 atomic percent titanium and 10 to 20 atomic percent ruthenium and/or iridium. Another object of the invention is to provide a method of fabrication of mixed metal oxide films containing a dual phase mixture of $TiO_2$ (rutile) and $RuO_2$ and/or $IrO_2$. It is an object of the invention to provide a method of fabrication of mixed metal oxide films by radio frequency assisted reactive ion plating whereby the films possess the above structure and chemistry. It is an object of the invention to provide a method of fabricating dense, columnar, non-porous, microcrystalline, electrically conductive, mixed metal oxide thin films. It is an object of the invention to provide a method of fabricating mixed metal oxide thin films with a resistivity of less than 100 ohm-cm. It is an object of the invention to provide a method of fabricating mixed metal oxide thin films which can sustain 150 amperes/$m^2$ current density for at least 50 hours (standard fresh water dissolution corrosion test) without a significant rise in the applied voltage or resulting damage to the film in relation to the active surface area of the anode. It is an object of the invention to provide a method of fabricating mixed metal oxide thin films with dissolution rates of less than 0.5 gram/amp/year in saltwater and with dissolution rates of less than 0.1 gram/amp/year in fresh water at a current density of 150 amperes/$m^2$. Other objects, aspects and advantages of the invention will be apparent from the description and the accompanying drawings.

DETAILED DESCRIPTION OF THE INVENTION

Figure 1:
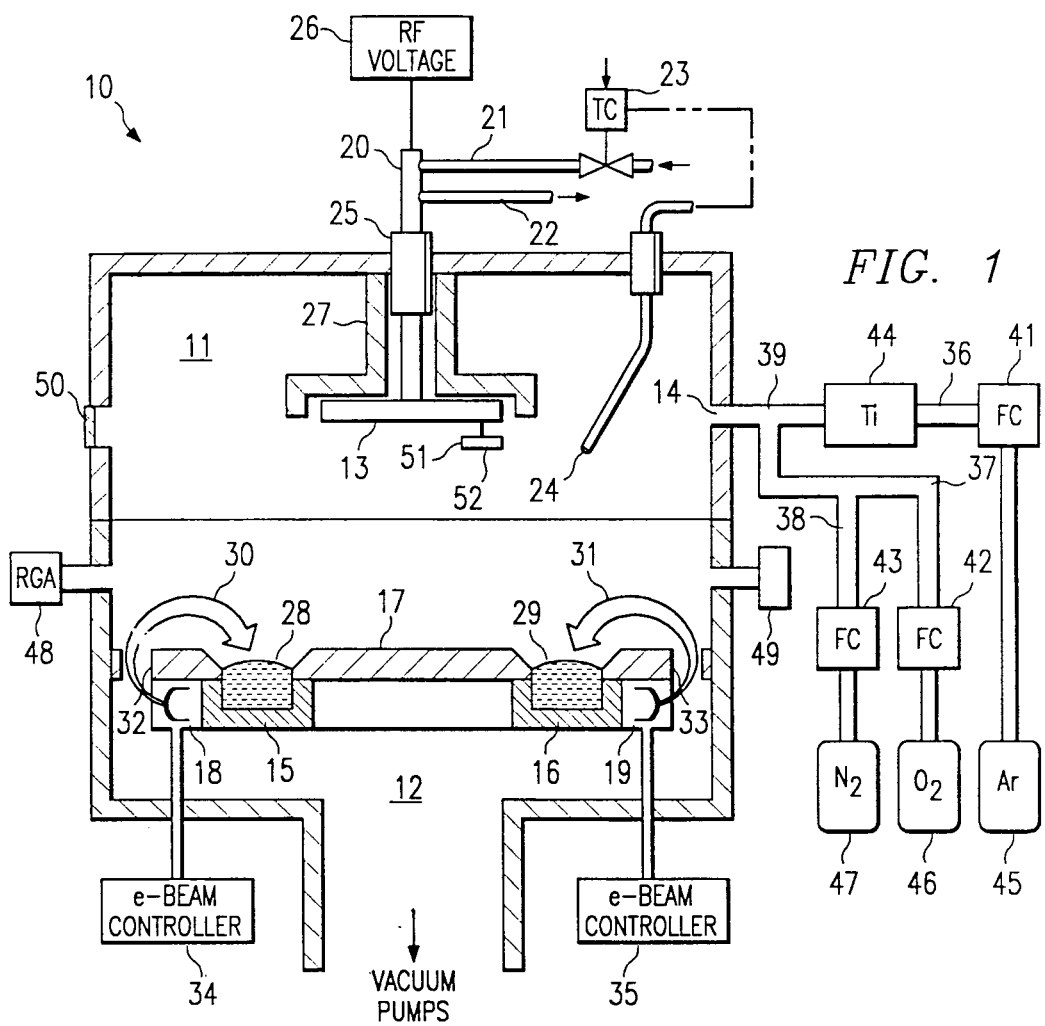
FIG. 1 is a schematic diagram of a radio frequency reactive ion plating system.

By their very nature underground and submersible structures are not readily observed in-situ. It is therefore imperative that impressed current cathodic protection anodes maintain their electrochemical activity over a significant period of time. Maintaining electrochemical activity refers to the anode's ability to continually provide a constant flow of current (and thus a constant current density) with little or no rise in applied potential while subjected to anodic polarization conditions. There are several mechanisms by which mixed metal oxide anodes lose their electrochemical activity.

One mechanism by which mixed metal oxide anodes based on $RuO_2$ - $TiO_2$ films experience losses in electrochemical activity during anodic polarization is attributed to the formation of a nonconducting oxide film at the mixed metal oxide coating-valve metal substrate interface. This insulating film has been shown to cause an increase in the resistance at the mixed metal oxide coating-valve metal substrate interface which is manifested by the potential increase required to sustain a constant flow of current. In addition, differences in the lattice parameters between the deposited mixed metal oxide film and the valve metal substrate can effect spalling of the mixed metal oxide coating thus destroying the anode. Though it is a fundamental characteristic of valve metals to form a potentially deleterious electrically insulating surface oxide film, it is precisely this characteristic which makes the valve metal a superior substrate for mixed metal oxide anodes. If the mixed metal oxide coating is mechanically damaged, the valve metal substrate will form an insulating oxide film on its exposed region. The insulating film serves to halt the flow of corrosion current on the exposed area and therefore keeps the substrate from going into solution. While a portion of the anode passivates, current continues to flow through the active mixed metal oxide coating, allowing the impressed current cathodic protection system to continue functioning.

Formation of a valve metal oxide film at the mixed metal oxide coating-valve metal substrate interface may occur because of the effect of an induced electrostatic field within the mixed metal oxide coating during polarization. The field can cause metal or oxygen ions to migrate through the deposited coating toward the valve metal substrate surface thereby providing the ionic species necessary for the formation of an insulating oxide film. Substrate oxidation can also occur in those areas where pores or cracks in the mixed metal oxide allow contact of an electrolyte with the substrate surface.

A second important mechanism affecting film activity pertains to the loss of some or all of the constituents comprising the mixed metal oxide film. Such action can occur during anodic polarization and has a detrimental effect on anode performance. For $RuO_2$ - $TiO_2$ films the effect is evidenced by ruthenium depletion. $RuO_2$ contributes heavily to the electronic conduction exhibited by these films and thus a lowering of its content reduces the ability of the anode to maintain a constant current flow without increasing the applied potential. The dissolution of films components and substrate oxidation are not necessarily independent processes. Both processes may occur simultaneously or sequentially under polarization conditions.

The physical and electrochemical properties exhibited by electrically conductive mixed metal oxide ceramic coatings are to a large extent a function of the methods employed in their fabrication. Traditionally, mixed metal oxide films have been fabricated via the thermal decomposition of organometallic precursors which are first brushed onto various valve metal substrates and subsequently annealed in air or oxygen atmospheres at temperatures ranging between 300° C. and 800° C. Other methods used to produce mixed metal oxide films include chemical vapor deposition and reactive ion plating.

Reactive ion plating is a plasma assisted physical vapor deposition technique which blends the elements of vacuum evaporation and sputtering with the presence of a glow discharge. It is a film deposition process in which the substrate surface and/or the depositing film is subjected to a flux of high energy particles sufficient to cause changes in the interfacial region or film properties as compared to deposited films fabricated through other techniques.

Reactive ion plating is a high vacuum deposition process performed in a vacuum chamber evacuated to a base pressure of roughly $10^{-6}$ Torr. Resistance heating, sputtering, or thermionic electron beam evaporation can be used to transform solid source materials, from which film atoms are derived, into their vapor states. When a thermionic electron beam evaporation system is used to melt and vaporize source material, a dual chamber design can be employed to create a pressure differential within the vacuum chamber. Pressures approaching $10^{-5}$ – $10^{-6}$ Torr are common in the lower chamber region housing the electron gun filaments while a pressure of approximately $10^{-2}$ Torr can be present in the upper chamber during deposition. Substrates are fixed to a negatively biased electrode located in the upper chamber and positioned adjacent to the glow discharge.

The glow discharge can be generated by either a direct current or high frequency alternating current source electrically connected to the substrate holder. A primary function of the glow discharge is to ionize the inert and reactive gases within the vacuum chamber thereby causing the negatively biased substrate, and deposited film atoms, to be continually bombarded by energetic ions and neutrals. Energetic particle bombardment results in the desorption or sputtering of surface contaminants from the substrate, i.e., sputter cleaning, increased density of active nucleation sites and substrate defects, increased mobility of adsorbed film atoms, and sputtering and redeposition of the film atoms themselves.

A high frequency alternating voltage bias serves to reverse the anode/cathode roles every half cycle, thus preventing a charge build-up on insulating substrates. During high frequency alternating voltage biasing, both electrodes develop a negative bias and both are therefore subjected to particle bombardment. However, the electrode serving as the substrate holder is much smaller in size than the second electrode, i.e., the vacuum chamber. This asymmetry in electrode dimensions causes the substrate holder to develop a greater bias with respect to the vacuum chamber, subjecting the substrate holder to the high energy particle flux (generated via the glow discharge) and thus to the sputtering process, just as it is under a direct current generated bias.

The ion plating process can be viewed as being in three stages: the initial stage incorporates those processes occurring prior to actual film deposition; the second stage is concerned with interface formation, and the final stage with film growth. Sputtering, the removal of surface atoms via momentum exchange with energetic particles, occurs prior to film deposition. Its function during the initial stage of ion plating is to remove contaminant atoms from the surface, alter the chemistry of compound substrates by preferentially sputtering one constituent with respect to another, create surface topography, and induce lattice defects or crystalline disorder. Continued particle bombardment during film deposition results in mixing, recoil implantation, and radiation enhanced diffusion, all of which promote the formation of chemically graded interfaces. Particle bombardment further serves to influence the morphology of the growing film as well as effect the formation of high temperature microstructures/phases at low deposition temperatures.

In general, the choice of direct current and high frequency generated glow discharge is a function of both the conductivity of the substrate material and the desired discharge intensity. However, the high frequency bias greatly increases the ionization level of the glow discharge over its direct current counterpart so that the auxiliary enhancement anode, normally positioned between the cathode/substrate holder and the source of vaporized metal in the direct current bias operation is not required for the high frequency bias operation. The increased ionization level in the high frequency glow discharge also permits the utilization of lower substrate temperatures during the coating operation. The use of the high frequency bias in the process of the present invention permits the production of mixed metal oxide coated anodes having long life at high current densities Referring now to FIG. 1, the reactive ion plater 10 utilizes a split chamber design such that the upper chamber 11 can be raised and lowered with respect to lower chamber 12 by a power driven hoist (not shown). The upper chamber 11 has the freedom of motion to pivot about its hoist axis, allowing access to the substrate holder (cathode) 13, gas inlet port 14, and copper crucibles 15, 16 (which serve as the hearths in which the solid source materials are placed). The aluminum baffle plate 17 separates the upper and lower chambers 11, 12 and isolates the electron gun assemblies 18, 19 from the greater pressures maintained in the upper chamber 11. Continuous pumping of the lower chamber 12 can be accomplished by suitable diffusion pumps (not shown). The chambers 11 and 12 are cylindrical in shape. The substrate holder/cathode 13 is a water cooled cylindrical stainless steel disc which is welded to multiple passageway pipe 20 that extends through the lid of the upper chamber 11. Cooling water can be passed through conduits 21 and 22 and the passageways in pipe 20 to maintain substrate holder 13 at a suitable temperature. The rate of flow of the cooling water through conduit 21 can be varied by temperature controller 23 responsive to the output of thermocouple 24 positioned adjacent substrate holder 13. The cathode/pipe assembly can be raised or lowered to vary the source-to-substrate distance by loosening a machined teflon block 25 which is designed much like a conflat feedthrough. The teflon block 25 serves to electrically isolate the cathode 13 from the wall of chamber 11 and is responsible for maintaining the vacuum seal at the cathode/pipe-assembly-to-chamber junction. A suitable source 26 of high frequency alternating voltage is electrically connected to cathode holder 13 via pipe 20. The frequency of the voltage output of source 26 can be any suitable value which permits the achievement of a substantial improvement in the physical characteristics of the mixed metal oxide coated substrate as compared with such substrates fabricated in a reactive ion plating chamber utilizing only a direct current bias on the cathode 13 instead of the high frequency bias. However, in general the frequency of the voltage output of source 26 will be in the range of about 1 KHz to about 300,00 MHz and more preferably will be in the range of about 50 KHz to bout 50 MHz. One suitable radio frequency generator operates at a frequency of 13.56 MHz and has an incident power capacity of 1.6 kilowatts. The radio frequency generator ignites and intensifies the glow discharge in chamber 11, thus sputter cleaning the substrate with chemically inert energetic ions and neutral atoms generated by the negative glow discharge before the coating constituents are injected into the glow discharge. When the coating constituents are present, a high degree of ionization and a uniform plasma are formed due to the high frequency electron oscillation caused by the radio frequency voltage generator. An aluminum shield 27 can be provided around substrate holder 13 to confine the active glow discharge region to the lower portion of the upper chamber 11.

Solid source materials 28 and 29 are evaporated in two diametrically opposed water cooled copper crucibles 15, 16 via thermionic electron beams 30 and 31 produced by electron gun assemblies 18 and 19 each of which is equipped with a 270 degree magnetically focused beam deflection system to direct the respective electron beam though an orifice 32 or 33 in baffle plate 17 and onto the exposed surface of source 28 or 29. The electron guns 18 and 19 are powered by electron beam controllers 34 and 35, respectively, which typically provide ten kilovolts with 0.1 to 0.6 Ampere at each electron gun.

The high purity gases which comprise much of the glow discharge are transported to the deposition chamber 11 via stainless steel conduits 36, 37, 38 and 39, Integrated into the gas transport system are calibrated mass flow controllers 41, 42 and 43 capable of varying individual gas flow rates from 0 to 100 standard cubic centimeters per minute (sccm). A titanium gettering furnace 44 is used to further purify high purity argon from source 45 before it enters the deposition chamber 11. In addition to argon, oxygen is available from source 46 as a glow discharge constituent. Nitrogen from source 47 can be used to pressurize the ion plating system to ambient (atmospheric) pressure prior to opening the upper chamber 11 for specimen exchange.

Monitoring consumption rates of reactive gases during reactive ion plating is accomplished through the use of a residual gas analyzer (RGA) 48. Prior to film deposition, consumption curves, which compare the variation in reactive gas ion current and pressure to increasing gas flow rates and electron beam gun current, are generated to indicate the gettering characteristics of the vaporized source material with respect to a particular reactive gas. During the deposition of ruthenium-titanium-oxide films the live time data generated by the RGA 48 can be used in conjunction with readings from capacitance manometer 49 of upper chamber pressure to assess the degree of chemical reactivity between the ruthenium and titanium source materials with the high purity oxygen gas. An RGA 48 used in concert with a capacitance manometer 49 can also provide the data necessary to calculate the partial pressures of individual gases in the deposition chamber 11. Visual inspection of in-situ deposition is made possible by one or more viewports 50 located in the upper chamber 11.

One or more substrates 51 having a surface 52 to be coated can be positioned on the substrate holder 13. Holder 13 can be provided with a plurality of tapped holes to accept substrates 51 of various sizes. Any of the valve metals can be used to form the surface 52. Suitable valve metals include titanium, tantalum, niobium, zirconium, tungsten, molybdenum, vanadium, and mixtures of any two or more thereof. However, titanium and niobium have been recognized as exhibiting superior physical, electrical, and electrochemical (corrosion) properties with respect to other valve metals considered as potential substrate materials for impressed current ceramic anodes. Breakdown, i.e., dissolution, of oxidized titanium occurs between 50-60 V (vs. the saturated calomel electrode (SCE) in electrolytes containing low chloride concentrations with low chloride-to-sulphate ratios. Breakdown of the passivating film on titanium in chloride-rich environments occurs at 10 V (vs. SCE). Conversely, the passivating oxide film which forms on niobium can withstand applied potentials up to 50 V (vs. SCE) in a salt water electrolyte without going into solution. The breakdown voltage of niobium exceeds 12 V. A ceramic anode comprised of mixed metal oxide film deposited onto a niobium substrate should, theoretically, possess the ability to withstand greater applied potentials than its titanium counterpart, and thereby supply greater current flow to its surrounding electrolyte and ultimately to the structure for which cathodic protection is being provided. Titanium, however, is utilized much more than niobium as a substrate material for electrically conductive mixed metal ceramic oxide anodes (including anodes consisting of $RuO_2$ and $TiO_2$ films) for two principal reasons. First, the cost of niobium is roughly eighteen times greater than that of titanium. Second, commercial attempts to deposit mixed metal oxide films onto niobium via thermal decomposition techniques have proven unsuccessful.

Any suitable noble metal can be employed as source 28 in the reactive ion plating process. The noble metals include platinum, palladium, ruthenium, iridium, osmium, and rhodium. As the oxides of ruthenium and iridium are known to exhibit metallic electrical conductivity over a wide range of temperatures, to have very low resistivities and very low dissolution rates, ruthenium and/or iridium are presently preferred as the noble metal to be used in the formation of the electrically conductive mixed metal oxide ceramic coating.

The valve metal employed as source 29 for the preparation of the mixed metal oxide coating can be any suitable valve metal, such as titanium, tantalum, niobium, zirconium, tungsten, molybdenum, and vanadium, with titanium being presently preferred.

For reactive ion plating operation, the upper chamber 11 is raised to allow attachment of substrates 51 to the substrate holder 13 and to allow filling of each of the crucibles 15, 16 with an evaporant charge. The plater 10 is then closed, evacuated to approximately 0.001 milliTorr, and backfilled with high purity argon (Ar) gas through line 36 to a nominal 10 millitorr upper chamber pressure. Once at the desired Ar backfill pressure, the substrate holder 13 is biased with negative high voltage RF current applied through pipe 20 to form a cold-cathode, negative glow discharge which fills most of the lower portion of plating chamber 11. Cooling water is circulated through line 21 to control the temperature of the substrate holder 13. The substrate 51 is sputter-cleaned with chemically inert ions and neutral atoms before ion plating begins. To initiate ion plating, flow controller 42 is actuated to introduce oxygen through lines 37 and 39 to the discharge/plating chamber 11 and the electron beam guns 18, 19 are brought up to power (usually 1-5 kW), melting and then gradually evaporating the evaporant charge material. The oxygen partial pressure in the upper chamber 11 can be measured with residual gas analyzer 48. After ion plating, the system is normally allowed to cool approximately one hour at high vacuum and is then vented (repressurized) with nitrogen gas before the plater 10 is opened for substrate removal.

Prior to film deposition the upper chamber 11 of the ion plating system 10 can be cleaned and lined with aluminum foil (not shown). Where the ion plater 10 is not dedicated to the deposition of one material system, the aluminum foil serves as a disposable liner allowing for quick cleanup between to deposition series and minimizes the extent of contamination from the various material systems. Cleaning of the chamber 11 can be followed by the loading of source material 28 and 29 into the copper crucibles 15 and 16. An initial run without substrates present serves to melt, further consolidate, and stabilize the source materials 28 and 29 and provides, via the vaporization of the source materials, a coating on the aluminum foil liner of film constituents which decreases the probability of contaminating the material system with xenoatoms generated through backsputtering. Consumption curves pertaining to the reactivity of the source materials 28 and 29 with the oxygen can be derived and examined upon completion of the initial run to determine potential processing windows, i.e., a plausible range of processing parameters, which result in deposited films with the desired microstructure, chemistry, and observable properties. The consumption curves compare the variation in reactive gas ion current and pressure to increasing gas flow rates and electron beam gun current from which data pertaining to the gettering characteristics of the vaporized source material, with respect to a particular reactive gas, is obtained.

Figure 2:
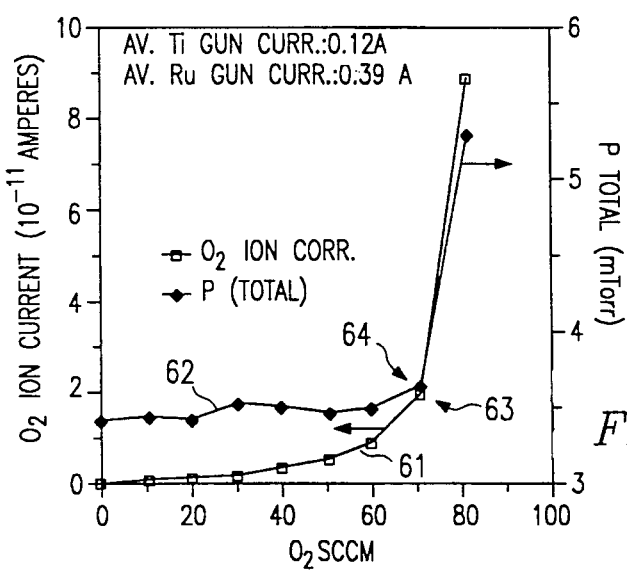
FIG. 2 is a graph of an oxygen consumption curve and a total pressure curve for reactive ion plating ruthenium oxide and titanium oxide.

Referring now to FIG. 2, using ruthenium metal and titanium metal as sources 28 and 29 respectively, the curve 61 is a plot of the oxygen ion current read from the RGA 48, as a function of the oxygen flow rate through flow controller 42 at constant ruthenium and titanium evaporation rates. The oxygen ion current reading is significant in that it represents the amount of unreacted (residual) oxygen remaining in the upper chamber 11 during deposition. The relation between oxygen ion current and unreacted (residual) oxygen is easily seen by noting the direct correlation between the oxygen ion current and the total system pressure (measured by the capacitance manometer 49) and represented by curve 62 in FIG. 2. The values of the currents to electron beam guns 18 and 19 are also shown in FIG. 2. The ruthenium and titanium evaporation rates are correlated to gun current readings, therefore any changes in the gun current readings represent similar changes in evaporation rates and also in oxygen gettering. A knee 63 in curve 61 appears at an approximate oxygen flow rate of 70 sccm, with a similar knee 64 appearing in curve 62. Below the knee 63 the vaporized ruthenium atoms and the vaporized titanium atoms are in competition for oxygen, while above knee 63 there is sufficient oxygen to react with the vaporized ruthenium atoms and the vaporized titanium atoms. However, if the oxygen concentration in chamber 11 becomes too high, the excess oxygen can react with the metal of the exposed surface of one or both of sources 28, 29, thereby poisoning the sources, reducing the evaporation rate of the metal from the poisoned source for a given electron gun current, and substantially increasing the slope of the curve 61 towards the vertical. It is highly desirable to operate substantially above the knee 63 and still be below the point at which significant poisoning of the source or sources occurs. In general, the presently preferred region is where the slope (incremental $O_2$ ion current/incremental $O_2$ flow rate in sccm) of curve 61 is in the range of about $2 \times 10^{-12}$ to about $10 \times 10^{-12}$.

If the evaporation rate of titanium is too large, then $TiO_2$ (anatase) with Ti at.% greater than 90 at.% will be produced, thus increasing the resistivity and causing failure in the dissolution test. If the ruthenium evaporation rate is too high, $RuO_2$ and/or Ru will be present in solid solution with Ru at.% greater than 20 at.%, resulting in dissolution test failure.

If the oxygen concentrations (partial pressure of oxygen in the glow discharge) is too low, multiple deleterious effects are possible:
i) $TiO_2$ (rutile) with Ru in solution will be fabricated resulting in dissolution test failure.
ii) TiO (cubic) with Ru in solution will be fabricated resulting in dissolution test failure.
iii) $TiO_2$ (anatase with or without rutile) with Ru in solution or with $RuO_2$ will be fabricated resulting in dissolution test failure and increased resistivity.

If the oxygen concentration is too high, the metal sources will be poisoned (source poisoning is the gettering of oxygen by the molten pool of the evaporation source) and the evaporation rates will be drastically decreased such that duration of deposition time is impractical. If the oxygen concentration is increased from any experimental reference point, the evaporation rates for the metal sources at the reference point would be higher than the rates after the oxygen increase. Also, the magnitude of change in the evaporation rate for each metal source would depend upon the metal's affinity for oxygen (titanium's affinity for oxygen is much greater than the affinities of ruthenium and iridium for oxygen).

The power density of the glow discharge contributes to the reaction of the metal species with the ionized/excited oxygen atoms by breaking the oxygen molecule and uniformly scattering the metal flux of atoms. If the power density of the glow discharge is too low, the concentration of available excited oxygen atoms will be decreased thus hindering the formation of the mixed metal oxides. Also, the density, microcrystallinity, and columnar nature of the morphology will be changed. If the power density of the glow discharge is too high, the deposition rate will be sufficiently decreased due to the sputtering of the substrates such that proper film growth will be hindered.

All of the above parameters are important for the fabrication of mixed metal oxides with the aforementioned properties, however, the key fabrication parameter is the relative nature of the metal evaporation rates to the oxygen concentration. If oxygen concentration is correct, but the evaporation rate of titanium is too high then $TiO_2$ (anatase) will be present and Ti at.% will be greater than 90 at.%, resulting in decreased film performance. If the oxygen concentration is correct, but the ruthenium evaporation rate is too high, then ruthenium will be present in solution and Ru at.% will be greater than 20 at.%, resulting in the aforementioned film behavior. If the titanium and ruthenium evaporation rates are correct, but the oxygen concentration is too low, then $TiO_2$ (rutile) or TiO (cubic) with ruthenium in solid solution will be fabricated with deleterious properties resulting. If the titanium and ruthenium evaporation rates are correct, but the oxygen concentration is too high, the metal sources will be poisoned during the fabrication process such that the original evaporation rates will be decreased (preferentially depending on the material) thus producing a film of incorrect chemistry and structure resulting in poor film performance.

The following representative parameter conditions can be used in a reactive ion plater having an inner diameter of 0.66 meter, manufactured by Innotec, Inc., for the RF assisted reactive ion plating fabrication process for the deposition of mixed metal oxide films consisting of 10 to 20 at.% Ru and 80 to 90 at.% Ti with the dual phase mixture of $TiO_2$ (rutile) and $RuO_2$ which exhibit the desired physical properties discussed earlier.

| | |
|---|---|
| Argon Flow Rate: | 15-25 sccm |
| Oxygen Flow Rate: | 95-100 sccm |
| Oxygen Ion Current: | $2 \times 10^{-11}$–$10 \times 10^{-11}$ Amperes |
| Glow Discharge Power: | 50-1000 Watts |
| Power Density: | 0.5-3.3 W/cm$^2$ |
| Ave Deposition Rate: | 1-1.5 nm/sec |
| Power to e-beams: | Ti: 1.1-1.5 kW |
| | Ru: 3.5-4.0 kW |
| | Ratio of Ru:Ti Power: 2.3-3.7 |

Experimental Procedure

The solid source materials used to grow oxide films of ruthenium and titanium consisted of 99.95% ruthenium powder (120 mesh) and 99.7% titanium rod (1 m lengths, each of which was 6.4 mm in diameter) purchased from Johnson Matthey, Aesar, Inc., Seabrook, N.H. The ruthenium powder was formed into 150 g, 35 mm diameter solid compacts via vacuum hot pressing in a Vacuum Hot Press Sintering Furnace Series 3600 manufactured by GCA Corporation, Vacuum Industries Division. The ruthenium powder was consolidated in an inert argon atmosphere and held at $0.6T_{mp}$ with 34.5 Pa uniaxial (hydraulic) pressure for 60 minutes; the same uniaxial pressure was maintained throughout the cooling cycle. Further consolidation of the ruthenium took place in the ion plater as the compacts were electron beam melted and then allowed to solidify. The titanium rod was sectioned into 25 mm lengths using a water cooled silicon carbide abrasive saw. After washing the titanium sections in ultrasonic baths of methanol and acetone, each section was placed in the ion plater's water cooled copper crucible for electron beam melting and consolidation.

The substrates used were Corning 7059 borosilicate glass slides (with dimensions of 25.4 mm x 25.4 mm x 1 mm) and unannealed 99.94% niobium rod (1 m lengths, 25.4 mm in diameter) purchased from the Cabot Corporation, Boyertown Pa. The niobium rod was machined into 25.4 mm diameter discs, each 5 mm thick, having a tapped hole with an 8-32 thread for mounting.

The unannealed, machined niobium substrates were initially ground to a surface finish equivalent to that given by 600 grit silicon carbide abrasive paper. The niobium discs were then immersed in a room temperature acid solution for chemical polishing. Chemical polishing was chosen over further mechanical polishing because of the impracticality associated with mechanically polishing large field specimen substrates. The acid solution itself was a mixture of concentrated hydrofluoric (HF), nitric ($HNO_3$), and hydrochloric (HCl) acids in the following proportions:

15 ml HF
30 ml $HNO_3$
30 ml HCl
30 ml deionized $H_2O$.

The time duration of immersion of the niobium discs in the room temperature acid solution was three minutes. At the end of the polishing period the substrates were washed in deionized $H_2O$ to dilute and remove any residual acid solution and were then placed into an acetone bath for ultrasonic cleaning.

Clean substrates 51 were affixed to the substrate holder 13 using ruthenium-titanium-oxide coated hardware. Fresh medical gloves and clean tweezers were always used to preserve surface cleanliness and reduce the time necessary for adequate evacuation of the chamber. Upon mounting the substrates 51 and loading the ruthenium and titanium sources 28, 29, the pump down sequence was initiated. During the pump down process the RGA 48 was engaged, the liquid nitrogen traps atop the diffusion pumps (not shown) were filled, and the gas conduits 36-39 were opened and evacuated. Once base pressure was achieved, purging of the gas lines 36-39 commenced and was monitored by observing the decline of contaminants within the upper chamber 11 via the RGA 48. The purging process was followed by the introduction of argon whose flow rate was controlled by flow controller 41 to correspond to an upper chamber pressure of 3 mTorr. Sputter cleaning of the substrate surface 52 ensued with an RF generated argon glow discharge. The electron beam guns 18, 19 were engaged five minutes prior to the end of the sputter cleaning process to slowly and uniformly warm the ruthenium and titanium sources 28, 29 to their respective vaporization temperatures. Both the electron beam guns 18, 19 and the oxygen gas concentration in chamber 11 were increased to their desired levels concurrently at the start of the deposition. Continuous monitoring of the oxygen partial pressure signal, given by the RGA 48, for data pertaining to the reactivity of oxygen with the ruthenium and titanium vapors occurred throughout the run. The electron beam guns 18, 19 were disengaged, the glow discharge extinguished, and the gas lines 36-39 closed at the end of the run. The chamber 11 was allowed to cool to approximately 40° C. before opening and removing substrates 51. Once the substrates 51 were removed or exchanged the plater 10 was again evacuated for the purpose of minimizing the adsorption of water molecules in its inner wall.

Seven series of runs were made, with each series being a plurality of substrates coated simultaneously in a single reactive ion plating operation, with the results being averaged for the particular series. In each series the power density was 3.3 w/cm$^2$, the maximum deposition temperature (as measured by thermocouple 24) was 400° C., and the deposition time was 30 minutes. Other processing parameters are set forth in Table 1.

TABLE 1

| | PROCESSING PARAMETERS | | | | |
|---|---|---|---|---|---|
| Specimen Series | Average Pressure | Average $O_2$ Flow Rate | Ti Gun Current | Ru Gun Current | Average Deposition Rate |
| A | 0.50 Pa | 61.1 sccm | 0.11 A | 0.40 A | 0.633 nm/s |
| B | 0.47 Pa | 73.5 sccm | 0.14 A | 0.41 A | 1.46 nm/s |
| C | 0.48 Pa | 95.5 sccm | 0.13 A | 0.39 A | 0.872 nm/s |
| D | 0.62 Pa | 97.1 sccm | 0.15 A | 0.40 A | 1.02 nm/s |
| E | 0.61 Pa | 100 sccm | 0.15 A | 0.35 A | 1.09 nm/s |
| F | 0.69 Pa | 96.7 sccm | 0.15 A | 0.32 A | 1.40 nm/s |
| G | 0.64 Pa | 96.4 sccm | 0.15 A | 0.32 A | 1.24 nm/s |

Both scanning and transmission microscopy (SEM and TEM, respectively) were employed to study the microstructure and morphology of the deposited oxide films. Scanning electron micrographs were taken using a Hitachi S-800 filed emission scanning electro microscope. All the scanning electron micrographs were of tensile fracture surfaces of ruthenium-titanium-oxide films deposited onto Corning 7059 borosilicate glass substrates. Film morphology, density and thickness were analyzed from data obtained via the SEM. Information pertaining to microstructure, elemental chemistry, and phases present before and after anodic polarization was obtained via the TEM. The TEM was a Phillips EM400T analytical electron microscope equipped with an EDAX 9100 energy dispersive spectroscopy (EDS) unit. An attempt was made to determine, through the use of selected area electron diffraction on broad-face specimens, the identity of the oxide phases present and whether they were segregated or finely dispersed throughout the film. A goal was to identify any structural and chemical changes occurring to the films as a result of their subjection to anodic polarization testing.

In addition to the use of selected area electron diffraction in the TEM, phase analyses were also conducted with a Rigaku D-MAX x-ray diffractometer. While there is little question that electron diffraction is the more sensitive of the two techniques, having the ability to provide detailed phase and crystallographic information on specific grains within a prepared foil, x-ray diffraction can yield phase and orientation data over greater areas and depths and requires virtually no sample preparation. X-ray diffraction is a useful technique to obtain general phase information quickly and with minimal effort.

Quantitative elemental analyses were performed on all the oxide films using a JEOL JXA 50A Electron Probe Microanalyzer equipped with light optics and a Tracor Northern TN4000 X-ray Analyzer. With this technique it is possible to determine the relative atomic percents of ruthenium and titanium (as well as argon and other trace elements) incorporated into the coatings. The microprobe data was also correlated to the ruthenium and titanium evaporation rates as a function of electron beam gun current. EDS was used as a semi-quantitative verification of the electron microprobe results.

Surface chemical analysis was conducted by Auger electron spectroscopy (AES) using the Perkin Elmer PHI 660 Scanning Auger Multiprobe in an effort to determine whether or not failure of the oxide films under anodic polarization was the result of the loss, through dissolution or oxidation, of one or more of the coating constituents. Comparisons of the Auger surface profiles of pristine (unpolarized) and polarized films with the aid of quantitative elemental data provided by a multiplex operation was used to identify differences in elemental content.

Samples of the fresh water electrolyte used during anodic polarization testing were analyzed for their ruthenium, titanium, and niobium concentrations by inductively coupled argon plasma spectroscope (ICAPS). The analysis was performed with a Jarrell-Ash Model 975 AtomComp Spectrometer. ICAPS data was used in conjunction with AES data to define the mechanism(s) of film failure.

As it is desirable for mixed metal oxide films to have low electrical resistivities, sheet resistances were measured by the four point probe technique using a Kulicke & Soffa Industries Model 4640 Four Point Probe on films deposited onto Corning 7059 glass substrates. By combining film thickness data with the sheet resistance measurements it was possible to calculate film resistivity.

Anodic polarization of the oxide films at a high current density was employed to determine their activity, i.e., their electrochemical behavior, under accelerated conditions. The objective of activity testing is to identify those mixed metal oxide films having the ability to maintain a stable flow of current with little or no rise in applied potential for extended time periods. The testing was performed using an EG&G Princeton Applied Research Model 173 Potentiostat/Galvanostat equipped with a Model 373 Current Converter. The potentiostat was operated in its galvanostatic mode to serve as a constant current source. Activity data was acquired by monitoring the time change in the potential difference between two graphite cathodic electrodes and a mixed metal oxide anodic electrode, the latter being forced to maintain a constant flow of current. Only mixed metal oxide films deposited onto niobium substrates were tested, and all specimens were subjected to a current density of 150 amperes per square meter of exposed mixed metal oxide coating surface in a fresh water electrolyte. Typical current densities encountered in impressed current cathodic protection systems are in the order of 25 amperes/m$^2$. The results for the various series of runs are set forth in Table 2.

TABLE 2

| Specimen Series | Film Thickness | Resistivity ($\Omega \cdot$ cm) | Decrease Film Activity | at. % Ti | at. % Ru | Chemistry/Phases Present* |
|---|---|---|---|---|---|---|
| A | 1.14 μm | $3.220\ 10^{-1}$ | Yes | 85 | 15 | TiO$_2$ (R) with Ru in Soln |
| B | 2.63 μm | $2.719\ 10^{-3}$ | Yes | 87.5 | 12.5 | TiO cubic with Ru in soln |
| C | 1.57 μm | 5.423 | No | 90 | 10 | TiO$_2$ (R) & RuO$_2$ |
| D | 1.83 μm | $2.375\ 10^{-3}$ | Yes | 52 | 48 | TiO$_2$ (R) & RuO$_2$ |
| E | 1.97 μm | $1.156\ 10^{-1}$ | No | 80.5 | 19.5 | TiO$_2$ (R) & RuO$_2$ |
| F | 2.53 μm | 112.5 | Yes | 95 | 5 | TiO$_2$ (A + R) & RuO$_2$ |
| G | 2.23 μm | beyond measuring capacity | Yes | 97.5 | 2.5 | TiO$_2$ (A + R) & RuO$_2$ |

*A = Anatase
R = Rutile

Figure 3:
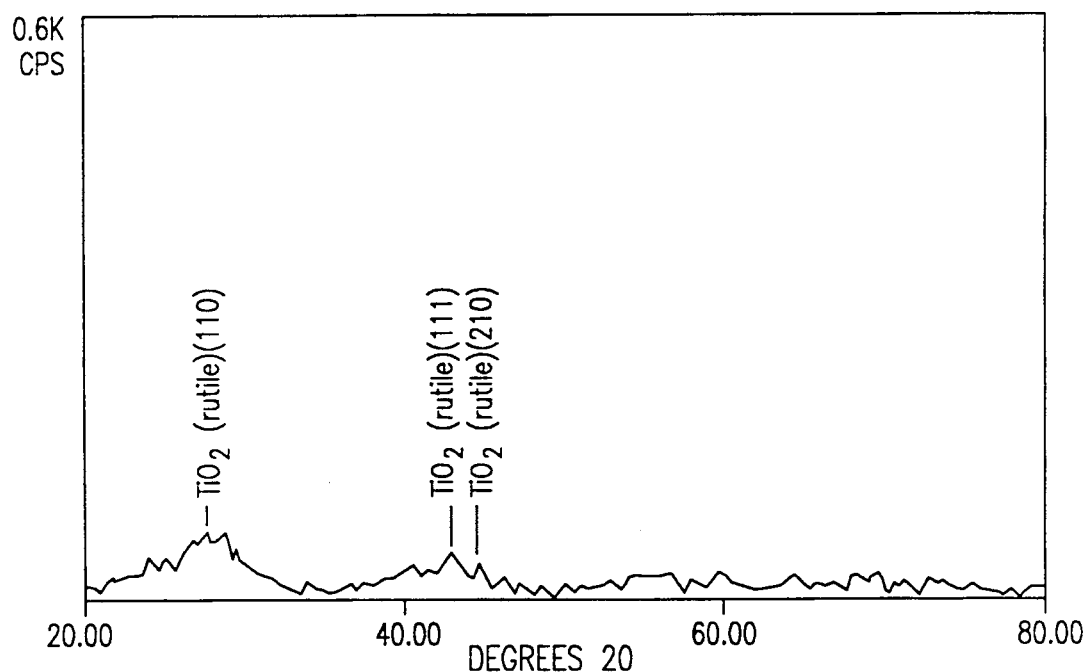
FIG. 3 is an X-ray diffraction $\theta$ scan of a series A film showing the presence of $TiO_2$ (rutile) diffraction peaks.

Table 1 lists the significant ion plating processing parameters chosen for the fabrication of ruthenium-titanium-oxide films on niobium and Corning 7059 borosilicate glass substrates. The consumption curve generated for the RuO$_2$ and TiO$_2$ system (FIG. 2) exhibited a knee at approximately 70 sccm, the point at which reactivity between oxygen gas and the vaporized ruthenium and vaporized titanium atoms is at its optimum. As shown in Table 1, series A films were fabricated using an average oxygen flow rate below that of the knee of the consumption curve. Quantitative elemental analysis of series A films via the electron microprobe showed them to contain approximately 85 at.% titanium and 15 at.% ruthenium (Table 2). Yet ruthenium, in neither its elemental or oxide phases, appeared in the film's x-ray diffraction pattern (FIG. 3). Instead, the diffraction pattern of FIG. 3 reveals only the presence of TiO$_2$ (rutile). The sole presence of TiO$_2$ (rutile) diffraction peaks, together with microprobe data verifying ruthenium as a film constituent, indicated that the ruthenium is incorporated into the film in solid solution. A mixed metal oxide film comprised of TiO$_2$ (rutile) and ruthenium in solution is plausible. The heat of formation of TiO$_2$ (rutile) is $-228,360$ g.cal/mol and the heat of formation of RuO$_2$ is $-57,290$ g.cal/mol. Of these two oxides, the formation of TiO$_2$ is the most favorable. Given that the oxygen flow rate is below the knee of the RuO$_2$ - TiO$_2$ consumption curve, it is likely that titanium getters all available oxygen when forming its oxide. The ruthenium source is then left with an insufficient amount of oxygen with which to react and is thus incorporated into the film in substantial solid solution.

The average oxygen flow rate was increased to approximately 73.5 sccm when fabricating series B mixed metal oxide films. The result, given in Table 2, was a TiO (cubic) film with ruthenium in solid solution. This was an interesting and initially perplexing result because TiO$_2$, and not TiO, is the thermodynamically stable oxide phase of titanium. The presence of ruthenium in the series B mixed metal oxide films was verified by both electron microprobe analysis and EDS in the TEM; the actual atomic percentages of titanium and ruthenium are listed in Table 2. Selected area electron diffraction of a series B TEM specimen clearly showed that the mixed metal oxide film has a TiO (cubic) crystal structure which, as with the series A films, contained no elemental or oxide phase of ruthenium. The heat of formation of TiO is roughly $-125,010$ g.cal/mol and it, like its TiO$_2$ counterpart, will form preferentially over RuO$_2$. Thus the ruthenium is incorporated into the film in solid solution. The formation of TiO can possibly be explained from the following. Upon concluding series A deposition, oxygen gas flow to the ion plating chamber 11 was intentionally continued to monitor and document total chamber pressure as power to the glow discharge 13 and electron beam guns 18, 19 was discontinued. Concurrently, the ruthenium and titanium source materials 28, 29, while beginning to cool, were just below their melting temperatures. The position of the titanium source 29 was such that it lay in the path of oxygen flow. If the titanium source material 29 was poisoned by residual oxygen during the time the compact (and vacuum chamber) was cooling, a small percent of the source's surface could have oxidized and formed TiO$_2$. Electron beam evaporation of oxide compounds like TiO$_2$ is accompanied by incongruent evaporation, i.e., the compound dissociates into constituents which do not volatilize at equal rates. The vapor species observed (listed in order of decreasing frequency) during the electron beam evaporation of TiO$_2$ are TiO, Ti, TiO$_2$, and O$_2$. The presence of a TiO film is not so surprising given a starting source material containing a significant amount of TiO$_2$ at its surface.

Figure 4:
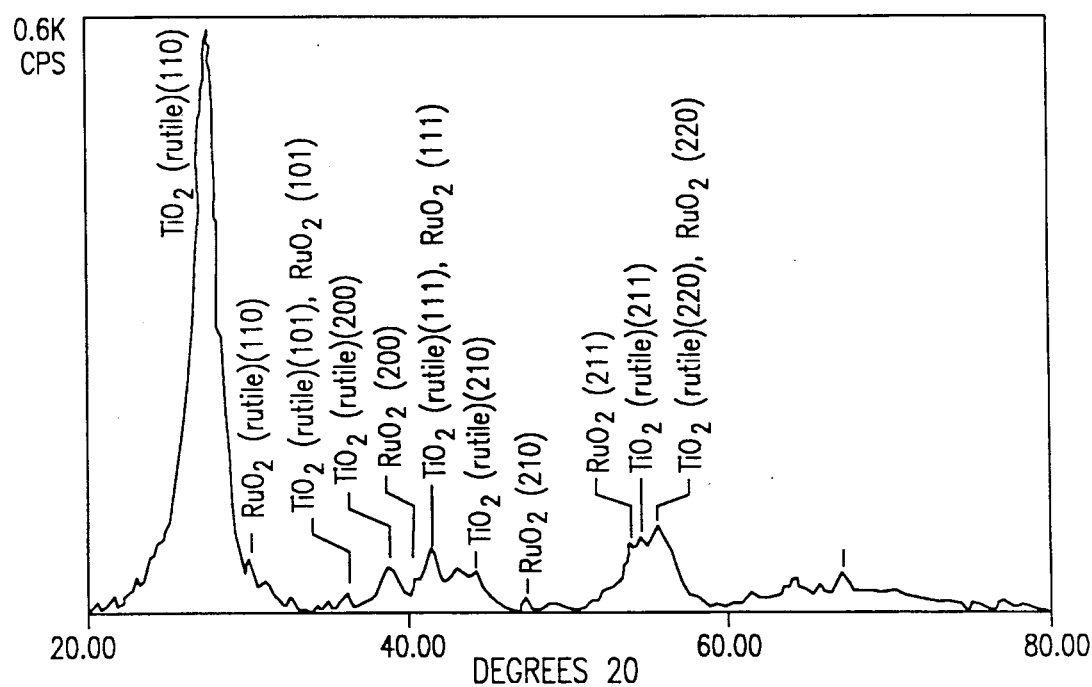
FIG. 4 is an X-ray diffraction $\theta$ scan of a series C film (which is also representative of D and E films) showing overlapping and separate $RuO_2$ and $TiO_2$ (rutile) diffraction peaks.

Series C, D, and E films, while comprised of different titanium and ruthenium contents (Table 2), each consist of what can be adequately described as a dual phase mixture of RuO$_2$ and TiO$_2$ phases. Peak splitting evident in x-ray diffraction $\theta$ scans (FIG. 4) from series C, D, and E films is generally not observed for RuO$_2$ - TiO$_2$ films processed at temperatures below 650° C. via conventional solidification techniques. Oxide annealing temperatures for mixed metal oxide films deposited via thermal decomposition are intentionally kept below 650° C. to minimize sintering effects. Sintering mixed metal oxide films often leads to cracking, which may serve to expose the substrate to an electrolyte thereby increasing the probability of deleterious chemical reactions and subsequent substrate dissolution. The absence of distinct RuO$_2$ and TiO$_2$ (rutile) phases in most mixed metal oxide films fabricated via thermal decomposition methods can be attributed to these lower processing temperatures. The high temperature microstructures of the series C, D, and E films are effected by the ion plating deposition technique. The high temperature RuO$_2$ - TiO$_2$ (rutile) microstructures were produced at relatively low deposition temperatures without inducing the cracking associated with high temperature sintering. A film comprised of a combination of RuO$_2$ and TiO$_2$ (rutile) phases is desirable in an impressed current mixed metal oxide anode. The average oxygen flow rates used to process series C, D, and E films were well above the knee of the RuO$_2$ - TiO$_2$ consumption curve. The formation of RuO$_2$ is attributed to the relatively high oxygen partial pressure within the deposition chamber. The RuO$_2$ - TiO$_2$ (rutile) combination formed only in runs where the average oxygen flow rates were about 95 sccm or higher (Table 1). As the atomic percentage of titanium is increased for each of the RuO$_2$ - TiO$_2$ films, it is accompanied by a corresponding increase in the film resistivity (Table 2).

Figure 5:
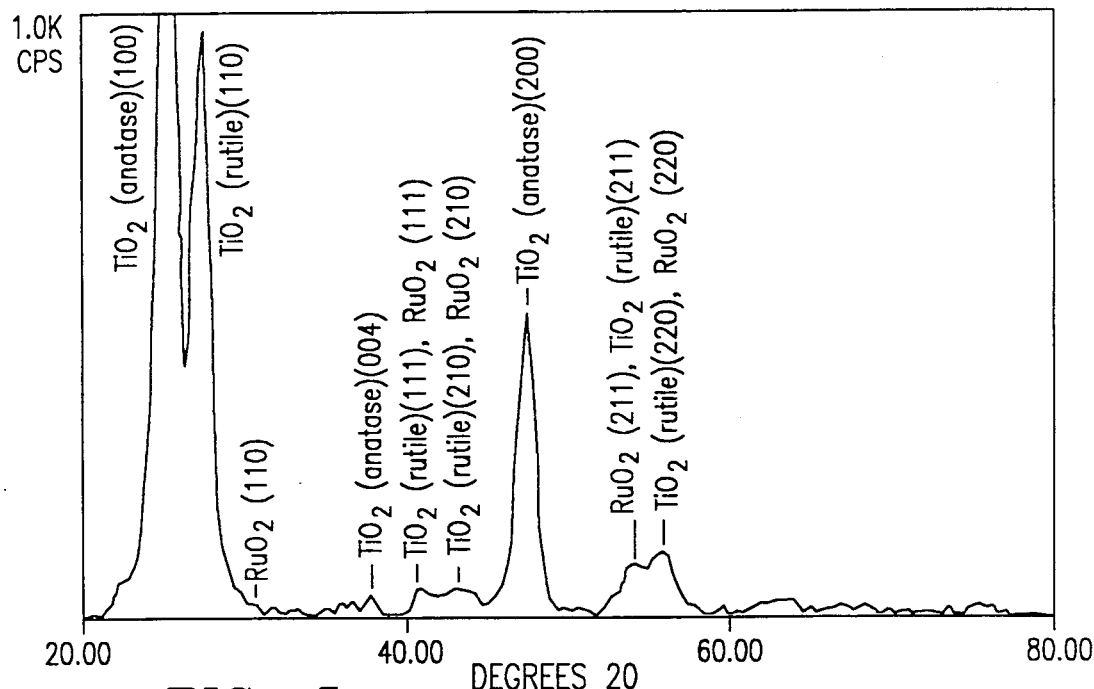
FIG. 5 is an X-ray diffraction $\theta$ scan of a series G film (which is also representative of the F films) showing the presence of $TiO_2$ (anatase) in addition to $RuO_2$ and $TiO_2$ (rutile) phases.

Series F and G films are mixed metal oxide coatings containing less than 10 at.% ruthenium while retaining the RuO$_2$ - TiO$_2$ (rutile) crystal structure. X-ray diffraction $\theta$ scan of series F and G films (FIG. 5) vividly show the presence of TiO$_2$ (anatase) in addition to RuO$_2$ and TiO$_2$ (rutile) diffraction peaks. The presence of TiO$_2$ (anatase), based on processing conditions used to fabricate series F and G films, may be related to the intentional decrease in ruthenium evaporation rates which lead to a decrease in the elemental ruthenium content. The remaining variable process parameters (Table 1) were kept virtually unchanged with respect to the deposition conditions employed in the fabrication of series C, D, and E films. The decreased ruthenium content will obviously lower the percentage of RuO$_2$ within the film. It is possible that a finite percentage of RuO$_2$, which has the same crystal structure as TiO$_2$ (rutile) and a similar lattice parameter, is necessary to stabilize TiO$_2$ (rutile), and that an elemental ruthenium content less than about 10 at.% is insufficient in providing the required percentage of RuO$_2$. The effect of lowering the RuO$_2$ content in the series F and G films are also manifested in high resistivity readings obtained for these films via the four point probe (Table 2) as RuO$_2$, a metallic conductor, contributes heavily to the conductivity of ruthenium-titanium-oxide films.

Scanning electron micrographs of tensile fracture surfaces provide data pertaining to film morphology, density, and thickness (thickness data is listed in Table 2). Differences in morphology, density and thickness associated with ion plated films are a function of a combination of many parameters including substrate surface roughness, substrate temperature during deposition, deposition rate, gas pressure, and the angle of incidence of the evaporant flux. The structure zone model developed by J. A. Thornton, J. Vac. Sci Technol. 4(6) (1986) 3059–3065, attempts to account for morphological variations resulting from differences in substrate surface temperature with respect to the melting temperature of the source material, as well as changes in argon gas pressure. The approach, however, does not account for many other important parameters affecting the nature of ion plated film growth, such as the rule of adatom mobility, to be of great use in relating morphological features to specific processing conditions.

Scanning electron micrographs of series A, C, and G films exhibited a zone 1 morphology as described by Thornton's structure zone model, i.e., all three mixed metal oxide films have a distinct columnar morphology with dome-shaped apexes. The rough, dome-shaped surface is a desirable feature for mixed metal oxide anode coating because it serves to increase the anode's effective surface area thereby enhancing electrochemical activity and decreasing film resistance. The anode films appeared to be very dense. While a scanning electron micrograph of a series B film had a columnar morphology with dome-shaped apexes at the surface, it did not exhibit the same zone 1 morphology which typifies the remaining series of mixed metal oxide films. Rather, the series B films contained morphological features similar to those described by the Thornton structure zone model for coatings with a zone T morphology. A Zone T (T for transition) morphology is characterized by a dense array of poorly defined fibrous, columnar grains. The columnar grains in the series B film were not aligned perpendicularly to the plane of the substrate, and the film appeared to be very dense.

The microstructures and compositions of crystalline phases within the ion plated mixed metal oxide films were examined with transmission electron microscopy. One goal was to identify those grains, or areas within a grain, containing either $RuO_2$ and/or $TiO_2$, and to determine whether or not the $RuO2$ and $TiO2$ phases were segregated or finely dispersed throughout the deposited film. In a broad-face bright field transmission electron micrograph of a series G film, moire fringes, visible within the planer sections of individual columns, were indicative of overlapping grains. The structural features within this micrograph were also illustrative of those found in series A–G films. Therefore, the columns are not comprised of single crystals. The concentric rings which make up the selected area electron diffraction pattern of the series G film also indicated that the microstructure is polycrystalline and randomly oriented (at least within the plane of the film). Though each of the mixed metal oxide films characterized with the SEM appeared to be very dense, porosity at the boundaries of the individual columns was evident in the transmission electron micrograph. The porous structure, however, may not penetrate much below the top surface of the film.

The activity test, described by T. Loucka, "The Reason for the Loss of Activity of Titanium Anodes Coated with a Layer of $RuO_2$ and $TiO_2$," J. Appl. Electrochem. 7 (1977) 211–214, was used to determine the electrochemical behavior of anodically polarized mixed metal oxide films. The objective of such a test is to identify those mixed metal oxide films possessing the ability to maintain a stable flow of current while anodically polarized, and which concurrently show little or no rise in applied potential for extended time periods. Mixed metal oxide films (deposited onto valve metal substrates) possessing such characteristics are ideal for use an impressed current cathodic protection anodes.

Figure 6:
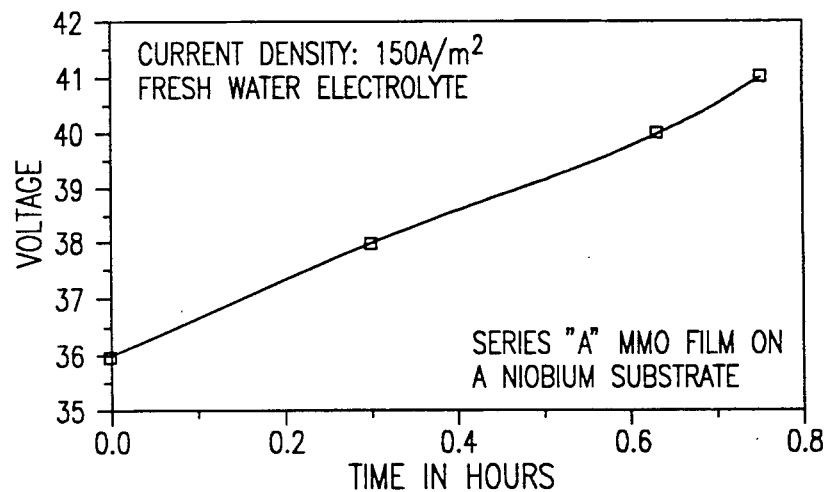
FIG. 6 is an activity plot of a series A film showing the linear increase in applied potential with time which was necessary to sustain a current density of 150 amperes per square meter.

FIG. 6, an activity plot of series A films, depicts the almost linear increase in voltage with respect to time which was required to sustain a current density of 150 amperes/$m^2$. While the potential increase was only 5 volts, activity testing was discontinued due to the film's rapid physical deterioration which indicated imminent failure. Failure refers to the film's inability to continue to support a constant flow of current with an applied potential of 85 volts or less. The 85 volt limit was chosen for two reasons. First, an impressed current cathodic protection anode operating at, or above 85 voltages is not an economically feasible device. Second, potential measurements above 85 volts approached the output limit of the available potentiostat/galvanostat. The series A film exhibited a physical transition from the pristine to polarized (deteriorated) condition, with the progression of film deterioration being radial, i.e., degradation first occurred at the coating edge and then continued toward the center of the niobium-coated disc. The mode of failure may be due to the fact that higher current densities exist at the edge of the coated disc; however, other films subjected to identical test conditions did not deteriorate in the same manner. Comparisons of Auger surface surveys of pristine and anodically polarized series A films showed a decrease in ruthenium content from the pristine to polarized condition. In addition, the surface survey showed the emergence of niobium in the polarized films; niobium is absent in surface surveys of pristine films. These Auger results suggested that the mechanism(s) of film failure, and loss of electrochemical activity, may be due to a combination of ruthenium loss and substrate oxidation. An Auger surface survey of the remaining coated area of a polarized series A film showed a marked decrease in the film's ruthenium content and virtually no change in titanium content. Another Auger surface survey, detailing the chemical content of the delaminated, exposed region of the niobium coated disc, indicated that the deposited series A film experience virtually total dissolution and was supplanted by the formation of a niobium oxide film. It is likely that onset of the series A failure was caused by the initial depletion of its ruthenium component.

Figure 7:
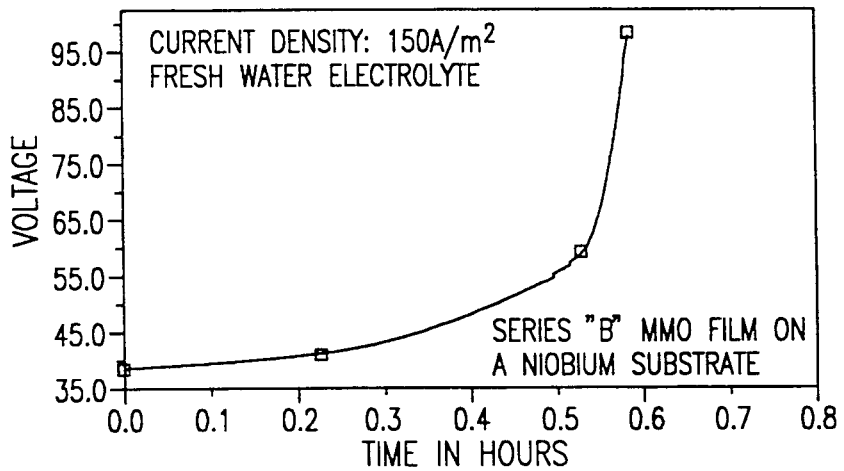
FIG. 7 is an activity plot of a series B film showing the rapid increase in applied potential with time to sustain a current density of 150 amperes per square meter.

While the mode of failure differed, the mechanism by which series B films failed was similar to that described for series A. Comparative Auger surface surveys of pristine and polarized series B films showed a marked decrease in ruthenium content. The physical deterioration of polarized series B films was distinguished by uniform film spalling and substrate oxidation. A series B activity plot, depicted in FIG. 7, is very similar to activity plots generated from electrodes forming non-conducting, surface oxide films. Though an electrically insulating niobium oxide surface film did form on the series B substrate, its formation was concurrent with, or preceded by a substantial loss of ruthenium from the deposited film.

Figure 8:
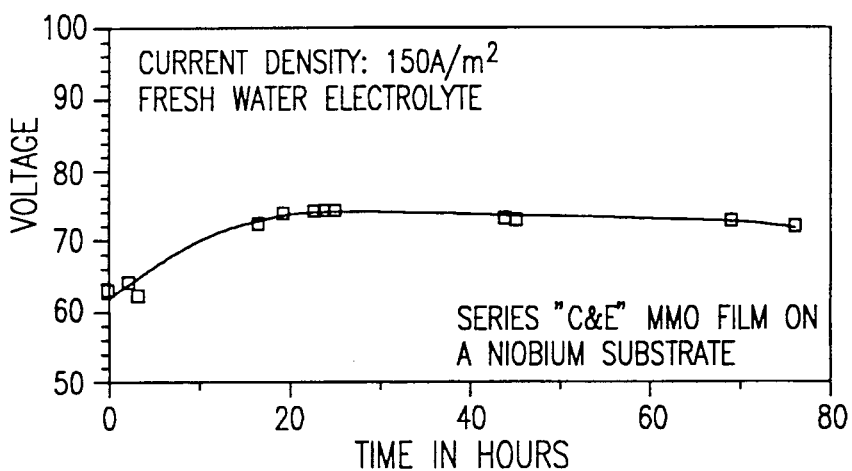
FIG. 8 is an activity plot of a series E film (which is also representative of series C films)

Series C, D, and E films displayed the greatest longevity of those tested. Of the three, series C and E best resisted coating degradation and electrochemical loss associated with extreme anodic polarization. FIG. 8 is an activity plot of a series E film; the series E activity plot is similar to those generated by series C films. The initial voltage readings of the series E film (as well as those for series D, F, and G) are approximately 35% greater than those reported for series A and B. The potential increase is directly related to a corresponding 35% decrease in the exposed surface area of the mixed metal oxide films. The original test fixture in which the niobium coated disks were mounted was damaged and replaced with a second fixture whose dimensions decreased the surface area of the film exposed to the electrolyte by roughly 35%. Apart from an initial rise in applied potential on the onset of polarization, no increases in voltage were required by either series C or E to maintain a constant flow of current over an extended period of time. Activity testing of the series C and E films was discontinued after 75 hours and 76 hours, respectively, and was followed by chemical analysis via Auger microprobe and phase analysis via selected area electron diffraction. The physical and chemical integrity of both series of films was preserved throughout the duration of the activity test of the pristine and polarized series C films. A discolored, slightly damaged outer ring at the edge of the coated niobium disk was due to the deterioration and removal of the gasket upon which the disk was seated while in its test fixture. Aside from blemishes associated with the substrate finish, the polarized film appeared undamaged. Auger surface surveys performed on both series C and E films indicated that no loss of coating constituents occurred as a result of anodic polarization. Selected area electron diffraction of the polarized films showed that each of series C and E films maintained the $RuO_2$ and $TiO_2$ (rutile) crystal structure through polarization.

Figure 9:
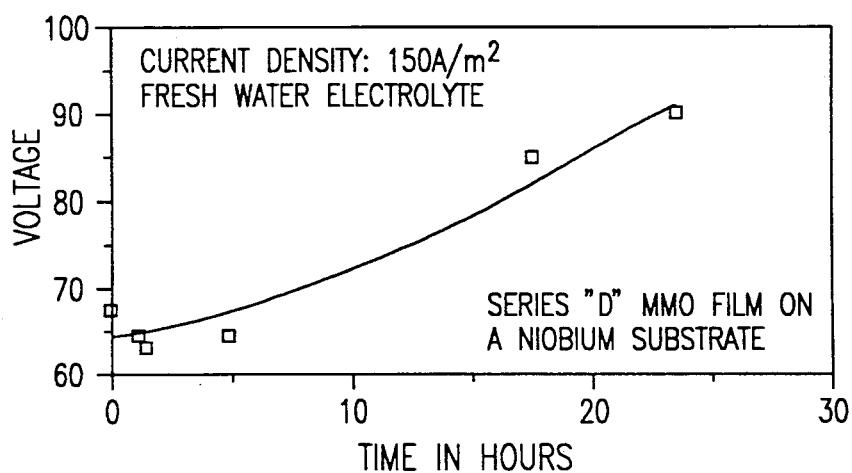
FIG. 9 is an activity plot of a series D film.

Series C films consisted of 90 at.% titanium and 10 at.% ruthenium, while series E films contained 80.5 at.% titanium and 19.5 at.% ruthenium (Table 2). Series D films, while also possessing the $RuO_2$ - $TiO_2$ (rutile) crystal structure, are comprised of 52 at.% titanium and 48 at.% ruthenium. Failure of the series D films occurred within 24 hours from the onset of anodic polarization (FIG. 9). No evidence of substrate spalling (from complete substrate oxidation) was apparent. The coatings exhibited a degree of discoloration following anodic polarization. Auger surface surveys performed on the pristine and polarized series D films showed a decrease in the overall ruthenium content resulting from anodic polarization. Loss of electrochemical activity may be attributed to the loss of ruthenium. Though the polarized series D films may contain as much ruthenium as the pristine, and successful, series C and E films, depletion of ruthenium in the series D films may have been accompanied by morphological changes which could adversely affect film performance. For example, ruthenium loss may have led to an increase in film porosity, or to the formation of an interconnected pore structure. Such an occurrence could lead to electrolyte-substrate contact resulting in localized substrate passivation. The formation of electrically insulating niobium oxide films would lead to an increase in the potential required to sustain the predetermined constant current flow.

It is evidence that the $RuO_2$ - $TiO_2$ (rutile) composition is at least in part responsible for the success of the series C and E anode films under anodic polarization conditions. A processing window exists between 80 at.% titanium (20 at.% ruthenium) and 90 at.% titanium (10 at.% ruthenium) within which ion plated mixed metal oxide films consisting of $RuO_2$ and $TiO_2$ (rutile) exhibit the necessary electrochemical properties required by impressed current cathodic protection anodes.

Figure 10:
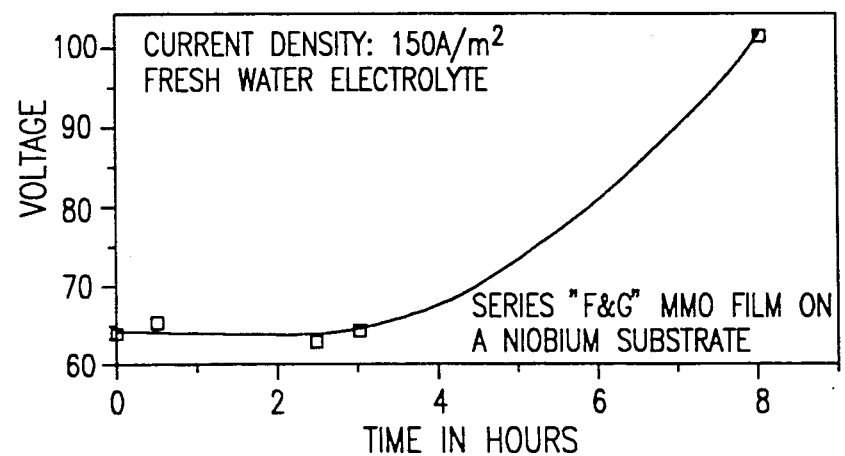
FIG. 10 is an activity plot of a series F film (which is also representative of series G films).

An activity plot for series F films is given in FIG. 10; the electrochemical activity of series G films was similar to that of series F. Both series F and G films experienced a rapid rise in potential with time which was accompanied by film spalling; failure of series F and G films occurred within 10 hours from the onset of polarization. While the presence of ruthenium in films from both series was verified by electron microprobe analysis (Table 2), and subsequently by EDS and selected area electron diffraction of TEM specimens, ruthenium was not detected in either the pristine or polarized films by the Auger microprobe. Auger electron spectroscopy is a surface sensitive technique. If the ruthenium was depleted at the film's surface, and should the depletion region extend to depths greater than 5 nm below the film's surface after sputtering, the element would not have been detected by an Auger surface survey. The as deposited series F and G films consisted of $TiO_2$ (anatase), $RuO_2$, and $TiO_2$ (rutile). Selected area electron diffraction of the polarized series F and G films showed only the presence of $RuO_2$ and $TiO_2$ (anatase). It is likely that a phase transformation from $TiO_2$ (rutile) to $TiO_2$ (anatase) was induced under polarization conditions. Because of the lattice parameter mismatch between $TiO_2$ (anatase), $TiO_2$ (rutile) and $RuO_2$, ($TiO_2$ (anatase): $a_o=3.78$, $c_o=9.51$; $TiO_2$ (rutile): $a_o=4.59$, $c_o=2.96$; $RuO_2$: $a_o=4.49$, $c_o=3.10$), a titanium rutile-to-anatase phase transformation could effect film spalling.

Film spalling may also have resulted from substrate oxidation. A full summary of activity tests for series A-G films is given in Table 3.

TABLE 3

SUMMARY OF ACTIVITY
(ANODIC POLARIZATION) TEST DATA

| Specimen Series | Time Duration of Anodic Polarization | Film Failure | Mechanism of Failure |
|---|---|---|---|
| A | 0.75 hrs | imminent | Ru loss & substrate oxidation |
| B | 0.58 hrs | Yes | Ru loss & substrate oxidation |
| C | 75 hrs | No | — |
| D | 24 hrs | Yes | Ru loss |
| E | 76 hrs | No | — |
| F | 8 hrs | Yes | undetermined |
| G | <10 hrs | Yes | undetermined |

The foregoing data demonstrates that a strong relationship exists between a mixed metal oxide film's structure, chemistry, and properties, and the processing techniques and parameters used to effect them. The processing window used to produce mixed metal oxide films with the desired microstructure and chemistry was also defined. Series C and E films, comprises of 90 at.% titanium, 10 at.% ruthenium, and 80 at.% titanium, 20 at.% ruthenium, respectively, in the form of a dual phase mixture of $RuO_2$ and $TiO_2$ (rutile), exhibited the greatest longevity and the highest degree of electrochemical activity with respect to those films fabricated and tested. Films comprised of solid solutions of $TiO_2$ (rutile) and ruthenium or TiO (cubic) and ruthenium displayed poor electrochemical activity under anodic polarization and were ineffective as impressed current anode materials. The presence of $TiO_2$ (anatase), with the $TiO_2$ (rutile) and $RuO_2$ phases, diminished the mixed metal oxide anode's capability to withstand extreme anodic polarization conditions. Obtaining films with a dual phase mixture of $RuO_2$ and $TiO_2$ (rutile) with the correct proportions of ruthenium and titanium was shown to be a function of oxygen pressure, and ruthenium and titanium evaporation rates, the latter being qualitatively correlated to the respective electron beam gun currents.

The mechanism of film failure, analyzed with x-ray diffraction, electron diffraction, electron microprobe, inductively coupled argon plasma spectroscopy, and Auger electron spectroscopy, were shown to be related to ruthenium (and therefore $RuO_2$) depletion and substrate oxidation. Inductively coupled argon plasma spectroscopic analysis of the electrolytes used in the anodic polarization of the films verified the presence of ruthenium in the electrolyte solution.

Electrically conductive, mixed metal oxide ceramic anodes produced in accordance with the preferred embodiments of the present invention are capable of providing a current density of 150 amperes per square meter of exposed surface of the ceramic coating in fresh water electrolyte for at least 20 hours, more preferably at least 50 hours, and even more preferably at least 100 hours without any increase in the voltage necessary to maintain the current density being more than 50% of the initial voltage necessary to achieve the current density. The presently preferred anodes are capable of providing a current density of 150 amperes per square meter of exposed coating surface for at least 75 hours without any substantial increase in the voltage required to maintain the current density during the period from 25 hours to 75 hours. The preferred anodes have a resistivity of less then 100 ohm-cm, more preferably less than 50 ohm-cm. The preferred anodes have a dissolution rate of less than 0.1 gram/ampere/year in fresh water electrolyte at a current density of 150 amperes per square meter of exposed coating surface.

Reasonable variations and modifications are possible within the scope of the foregoing disclosure, the drawings, and the appended claims to the invention.

We claim:

1. A process of preparing a mixed metal oxide coated substrate which comprises:

providing in a reactive ion plating chamber a source of a first noble metal;

providing in said reactive ion plating chamber a source of a first valve metal;

positioning in said reactive ion plating chamber a substrate having a surface to be coated, said surface being formed of a valve utilizing a first evaporating means to evaporate first noble metal from said source of a first noble metal, thereby forming vaporized first metal atoms in said reactive ion plating chamber;

utilizing a second evaporative means to evaporate metal from said source of a first valve metal, thereby forming vaporized second metal atoms in said reactive ion plating chamber;

controlling said first evaporation means to achieve a rate of evaporation of said noble metal and said second evaporation means to achieve a rate of evaporation of said first valve metal such that the ratio of said vaporized first metal atoms in said reactive ion plating chamber to said vaporized second metal atoms in said reactive ion plating chamber is at a value suitable to form a coating on said substrate surface with the ratio of first noble metal atoms in said coating to first value metal atoms in said coating being at a desired value;

supplying oxygen to said reactive ion plating chamber at a flow rate suitable to provide an amount of oxygen in said reactive ion plating chamber sufficient to react with said first metal atoms and said second metal atoms;

supplying alternating voltage to said substrate in said reactive ion plating chamber during evaporation of said first noble metal and evaporation of said first valve metal, thereby depositing on said surface of said substrate a coating of valve metal oxide and noble metal oxide;

wherein said alternating voltage to said substrate in said reactive ion plating chamber during evaporation of said first noble metal and evaporation of said first valve metal, thereby depositing on said surface of said substrate a coating of valve metal oxide and noble metal oxide;

wherein said alternating voltage is a radio frequency voltage;

wherein said amount of said oxygen is below the value at which there would be a level of reaction between the oxygen in the reactive ion plating chamber and at least one of said source of a first valve metal and said source of a first noble metal sufficient to substantially poison the thus reacted source;

wherein the value of the flow rate of oxygen is above the knee in the plot of oxygen ion current as a function of the oxygen flow rate at constant evaporation rates of said first noble metal and said first valve metal;

wherein said first noble metal is ruthenium and said first valve metal is titanium;

wherein the titanium oxide in said coating is substantially in the rutile form and at least substantially free of the anatase form; and wherein the ratio of ruthenium atoms in said coating to titanium atoms in said coating is in the range of about 10:90 to about 20:80.

2. A process in accordance with claim 1, wherein said surface is formed of titanium.

3. A process in accordance with claim 2 wherein the oxygen flow rate is in the region of the plot of oxygen ion current as a function of the oxygen flow rate at constant evaporation rates of ruthenium and titanium where the slope of the plot is in the range of about $2 \times 10^{-12}$ to about $10 \times 10^{-12}$, said slope being the incremental $O_2$ ion current/incremental $O_2$ flow rate in sccm, and wherein said coated substrate is an anode capable of providing a current density of 150 amperes per square meter of exposed surface of said coating in fresh water electrolyte for at least 20 hours without any increase in the voltage necessary to maintain said current density being more than 50% of the initial voltage necessary to achieve said current density.

4. A process in accordance with claim 1, wherein said surface is formed of niobium.

5. A process in accordance with claim 4, wherein the oxygen flow rate is in the region of the plot of oxygen ion current as a function of the oxygen flow rate at constant evaporation rates of ruthenium and titanium where the slope of the plot is in the range of about $2 \times 10^{-12}$ to about $10 \times 10^{-12}$, said slope being the incremental $O_2$ ion current/incremental $O_2$ flow rate in sccm, and wherein said coated substrate is an anode capable of providing a current density of 150 amperes per square meter of exposed surface of said coating in fresh water electrolyte for at least 20 hours without any increase in the voltage necessary to maintain said current density being more than 50% of the initial voltage necessary to achieve said current density.

6. A process of preparing a mixed metal oxide coated substrate which comprises:

providing in a reactive ion plating chamber a source of a first noble metal;

providing in a reactive ion plating chamber a source of a first valve metal;

positioning in said reactive ion plating chamber a substrate having a surface to be coated, said surface being formed of a valve metal;

utilizing a first evaporate means to evaporate first noble metal from said source of a first noble metal, thereby forming vaporized first metal atoms in said reactive ion plating chamber;

utilizing a second evaporate means to evaporate metal from said source of a first valve metal, thereby forming vaporized second metal atoms in said reactive ion plating chamber;

controlling said first evaporation means to achieve a rate of evaporation of said noble metal and said second evaporation means to achieve a rate of evaporation of said first valve metal such that the ratio of said vaporized first metal atoms in said reactive ion plating chamber to said vaporized second metal atoms in said reactive ion plating chamber is at a value suitable to form a coating on said substrate surface with the ratio of first noble metal atoms in said coating to first valve metal atoms in said coating being at a desired value;

supplying oxygen to said reactive ion plating chamber at a flow rate suitable to provide an amount of oxygen in said reactive ion plating chamber sufficient to react with said first metal atoms and said second metal atoms;

applying alternating voltage to said substrate in said reactive ion plating chamber during evaporation of said first noble metal and evaporation of said first valve metal, thereby depositing on said surface of said substrate a coating of valve metal oxide and noble metal oxide;

wherein said alternating voltage is a radio frequency voltage;

wherein said amount of oxygen is below the value at which there would be a level of reaction between the oxygen in the reactive ion plating chamber and at least one of said source of a first valve metal and said source of a first noble metal sufficient to substantially poison the thus reacted source;

wherein the value of the flow rate of oxygen is above the knee in the plot of oxygen ion current as a function of the oxygen flow rate at constant evaporation rates of said first noble metal and said first valve metal;

wherein said first noble metal is iridium and said first valve metal is titanium;

wherein the titanium oxide in said coating is substantially in the rutile form and at least substantially free of the anatase form; and wherein the ratio of iridium atoms in said coating to titanium atoms in said coating is in the range of about 10:90 to about 20:80.

7. A process in accordance with claim 6, wherein said surface is formed of titanium.

8. A process in accordance with claim 7, wherein the oxygen flow rate is in the region of the plot of oxygen ion current as a function of the oxygen flow rate at constant evaporation rates of iridium and titanium where the slope of the plot is in the range of about $2 \times 10^{-12}$ to about $10 \times 10^{-12}$, said slope being the incremental $O_2$ ion current/incremental $O_2$ flow rate in sccm, and wherein said coated substrate is an anode capable of providing a current density of 150 amperes per square meter of exposed surface of said coating in fresh water electrolyte for at least 20 hours without any increase in the voltage necessary to maintain said current density being more than 50% of the initial voltage necessary to achieve said current density.

9. A process in accordance with claim 6, wherein said surface is formed of niobium.

10. A process in accordance with claim 9, wherein said coated substrate is an anode capable of providing a current density of 150 amperes per square meter of exposed surface of said coating in fresh water electrolyte for at least 20 hours without any increase in the voltage necessary to maintain said current density being more than 50% of the initial voltage necessary to achieve said current density.

* * * * *